United States Patent
Hülsmann et al.

[11] Patent Number: 6,088,241
[45] Date of Patent: Jul. 11, 2000

[54] FOIL-TYPE CONNECTOR FOR MOTOR-VEHICLE SUBASSEMBLIES

[75] Inventors: Thomas Hülsmann, Velbert; Damien Labonde, Essen; Lothar Patzelt, Heiligenhaus, all of Germany

[73] Assignee: Kiekert AG, Heiligenhaus, Germany

[21] Appl. No.: 09/086,185

[22] Filed: May 28, 1998

[30] Foreign Application Priority Data

Jul. 26, 1997 [DE] Germany .......................... 197 32 224

[51] Int. Cl.⁷ .................................................. H02B 1/04
[52] U.S. Cl. .................... 361/826; 174/257; 307/10.1; 361/789; 439/620
[58] Field of Search ................. 244/5, 119; 206/484, 206/485; 174/72 A, 117 F, 138 R, 254; 307/10.1; 439/34, 620; 200/5 A, 292, 86 R; 361/749, 789, 790, 784, 785, 826, 827

[56] References Cited

U.S. PATENT DOCUMENTS

| | | |
|---|---|---|
| 3,911,234 | 10/1975 | Kotaka . |
| 4,066,851 | 1/1978 | White . |
| 4,410,574 | 10/1983 | Battochio ................................... 428/43 |
| 4,939,792 | 7/1990 | Urbish . |
| 5,130,499 | 7/1992 | Kijkshoorn . |
| 5,387,126 | 2/1995 | Austin ..................................... 439/516 |
| 5,417,575 | 5/1995 | McTaggart . |
| 5,579,574 | 12/1996 | Colleran . |
| 5,805,402 | 9/1998 | Maue ....................................... 361/93 |

FOREIGN PATENT DOCUMENTS

| | | |
|---|---|---|
| 30 23 905 | 1/1982 | Germany . |
| 38 42 340 | 10/1988 | Germany . |

*Primary Examiner*—Gerald Tolin
*Attorney, Agent, or Firm*—Herbert Dubno; Andrew Wilford

[57] ABSTRACT

A connector for interconnecting a plurality of spaced electrical subassemblies in a motor-vehicle door has a basically rectangular flexible foil having a core part and formed with a plurality of strips extending from the part and carrying conductive paths. The strips are separable from one another and foldable to extend to the different subassemblies. The conductive strips and the core part are formed of a flexible and conductive material or of an insulating synthetic resin provided with the conductive paths. This core part has a plurality of different fields each provided with electronic circuit components, for instance a key-pad field, a decoding field, a processing field, an H-bridge field, and a transfer field. The circuit components can be passive or active, for instance whole integrated circuits can be mounted on the core part.

7 Claims, 3 Drawing Sheets

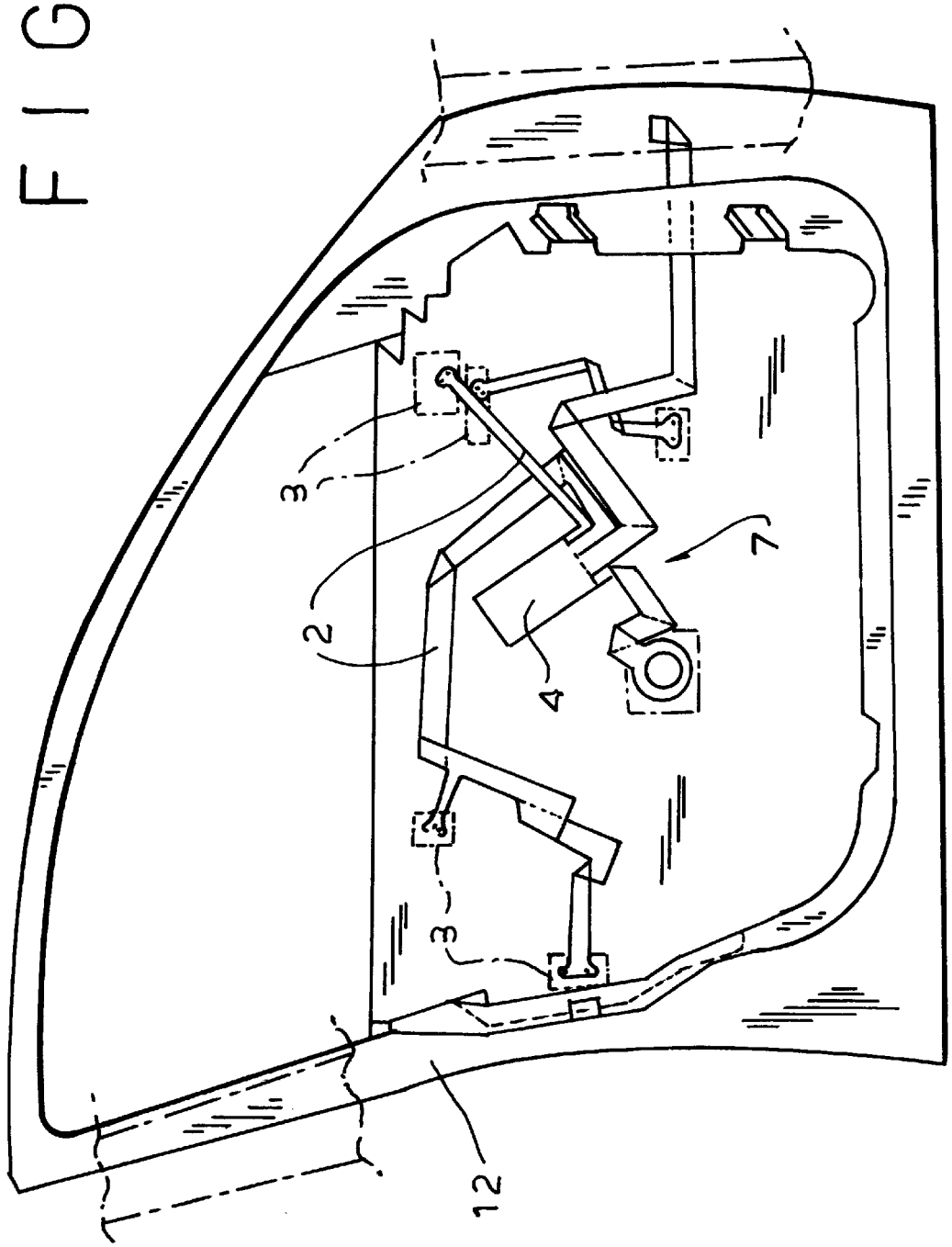

FOIL-TYPE CONNECTOR FOR MOTOR-VEHICLE SUBASSEMBLIES

FIELD OF THE INVENTION

The present invention relates to a system for electrical connection to motor-vehicle subassemblies. More particularly this invention concerns a system for connecting the subassemblies of a motor vehicle to each other and to associated controllers and power supplies.

BACKGROUND OF THE INVENTION

In, for example, a motor-vehicle door it is standard to have several subassemblies that each are or have electrical components. The latch has an actuator operated by the central locking system, a window motor is provided to raise and lower the glass, a speaker is connected to the vehicle's sound system, an external rear-view mirror has a motor for up-down and side-to-side adjustment, position switches are associated with the door, window, and latch to report conditions, and often a control pad is provided for operating these various actuators. At one time all these subassemblies were connected together and to the on-board power supply or controller via respective wiring harnesses that were meticulously hooked up individually.

It has been suggested in German patent 3,842,340 of Kleinbohl to apply the wiring as flexible conductors laminated to the shield sheet that is typically suspended in the door and that serves to keep water from the window off the electrical components. The conductors have ends that are attached to the various subassemblies and that all meet at one location where a plug/socket arrangement is provided for connection to the on-board power supply and controllers. A similar arrangement is provided in 3,023,905 also of Kleinbohl which is used to make connections to the subassemblies of the vehicle's instrument panel.

In all these systems either the connector harness, whether a conventional wire one or of the foil type, is fairly complex and expensive all by itself. The production of a foil-type harness invariably means working with a very large workpiece, so applying conductive paths to it and making connections for the various subassemblies is an expensive and difficult operation.

OBJECTS OF THE INVENTION

It is therefore an object of the present invention to provide an improved foil-type electrical connection system particularly usable for motor-vehicle subassemblies.

Another object is the provision of such an improved foil-type electrical connection system particularly usable for motor-vehicle subassemblies which overcomes the above-given disadvantages, that is which is inexpensive to manufacture but easy to install.

SUMMARY OF THE INVENTION

A connector for interconnecting a plurality of spaced electrical subassemblies in a motor-vehicle door has according to the invention a basically rectangular flexible foil having a core part and formed with a plurality of strips extending from the part and carrying conductive paths. The strips are separable from one another and foldable to extend to the different subassemblies.

The conductive strips and the core part are formed of a flexible and conductive material or of an insulating synthetic resin provided with the conductive paths. This core part in accordance with the invention has a plurality of different fields each provided with electronic circuit components, for instance a key-pad field, a decoding field, a processing field, an H-bridge field, and a transfer field. The circuit components can be passive or active, for instance whole integrated circuits can be mounted on the core part.

Since the individual conductors are constructed to be separated and folded out, it is possible to make the connector so that, prior to folding out and installation, it is very compact. Thus the connector according to the invention uses materials very efficiently. With the prior-art systems it was necessary to stamp the connector out of or apply it to a very large carrier sheet most of which was wasted or served no function. As a result the basic support foil of the connector of this invention can be made by a relatively compact stamping machine with no waste of material for a significant saving in manufacturing costs. Then any circuit elements are applied and it is delivered as is to the user who separates and folds out the conductors immediately prior to installation in the motor-vehicle door. The strips according to the invention extend compactly next to one another prior to folding out for connection to the subassemblies and are stamped from the foil. The foil is formed with perforations between the strips so they can be separated readily by the installer.

In accordance with the invention the strips are formed with crosswise weakened lines. This facilitates proper folding of them. These lines can extend at 45° to the strips to form a 90° bend, or can be at 45° to a 90° bend to form a straight extension. Other angles can be used to align the ends of the strips with the subassemblies—switches, motors, sensors, plugs, and sockets—they must be connected to.

The core part according to the invention is formed with a keypad field and is provided with an elastic perforated mat overlying the keypad field so that a keypad can engage through perforations in the mat with the conductive paths. Furthermore to ease delivery of the connector to the installer a plurality of such connectors are connected together in a roll with perforated tear lines between adjacent connectors. Thus the user simply rips off the end connector, sets the core part in position, and then folds out the various strips and connects them.

The foil in accordance with the invention is made of an electrically insulating synthetic resin. Thus it can easily resist the vibration and the like it is subjected to in a motor vehicle.

BRIEF DESCRIPTION OF THE DRAWING

The above and other objects, features, and advantages will become more readily apparent from the following description, reference being made to the accompanying drawing in which:

FIG. 3 shows the connector according to the invention installed in a motor-vehicle door.

SPECIFIC DESCRIPTION

Figure 1:
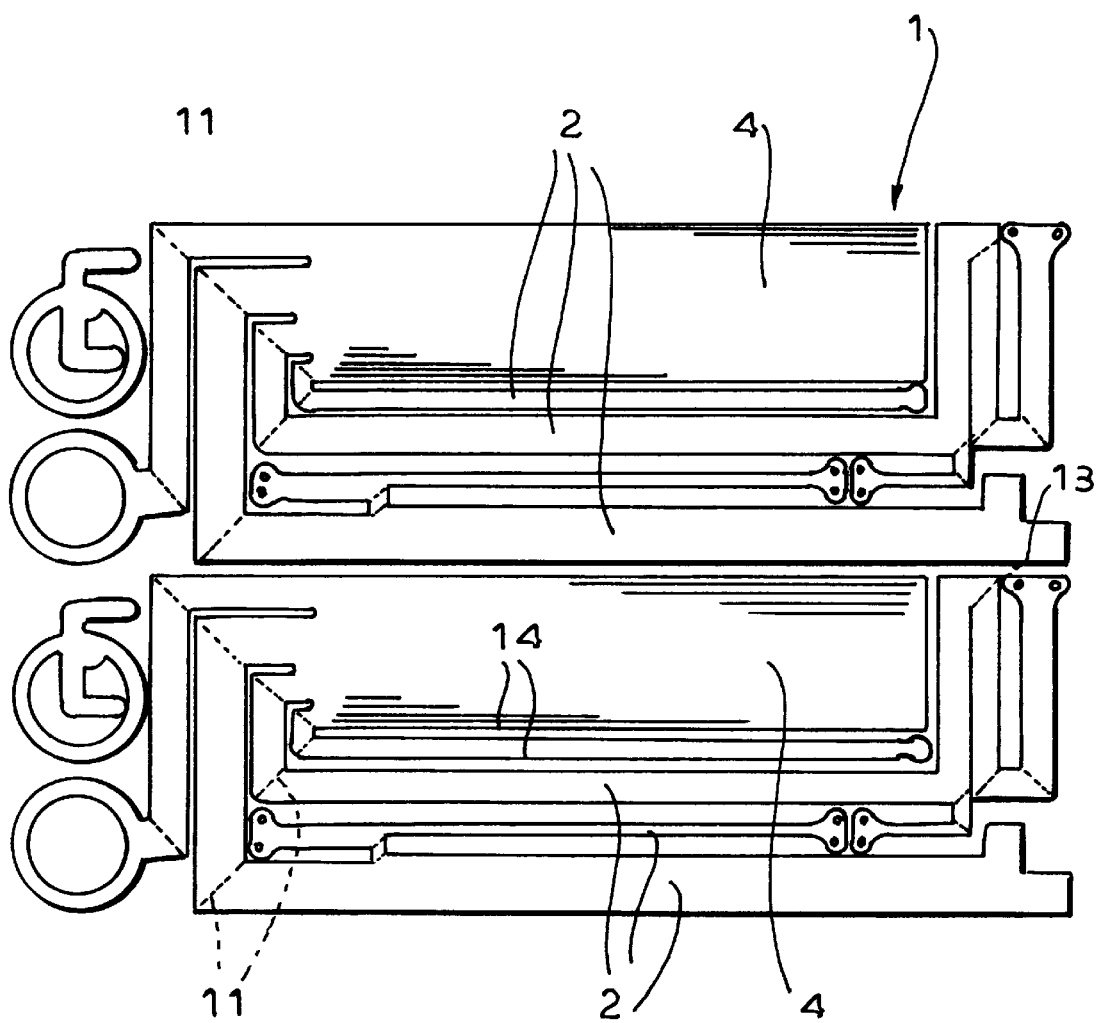
FIG. 1 shows two detachably connected foil-type connectors according to the invention.

As seen in the drawing 1 a foil-type connector 1 is provided with conductive paths or strips 2 intended for connecting together subassemblies 3, here a door latch, central lock, window motor, and the like of a motor-vehicle door 12. The foil-type connector 1 starts out with a basically rectangular shape and can be delivered on a roll or the like connected via a frangible and normally perforated web 13 with another such connector 1. At its center each connector 1 has a core part 4 from which the various conductive strips 2 extend.

Figure 2:
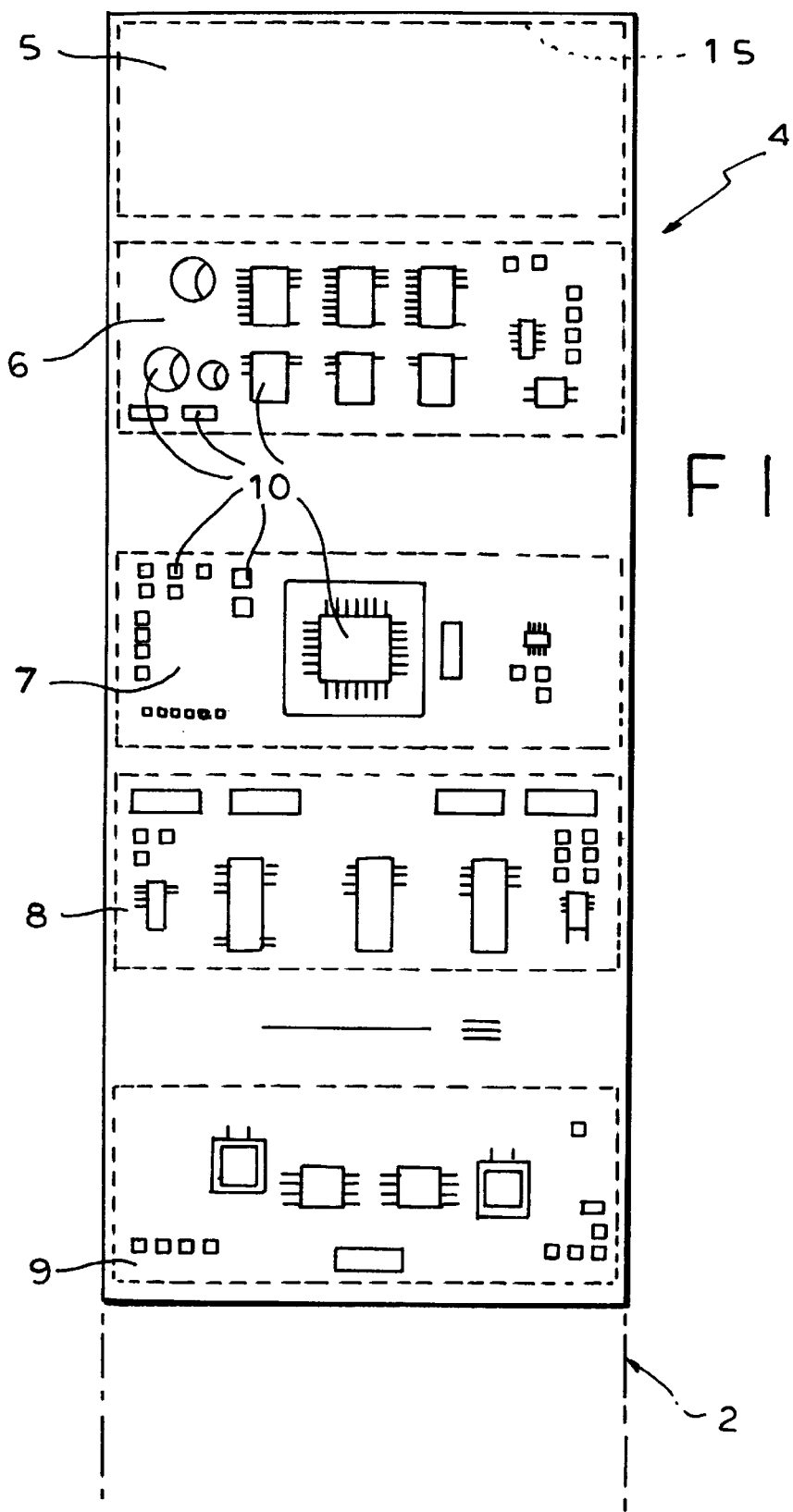
FIG. 2 shows the core part of the connector in enlarged scale.

As shown in FIG. 2 the core part 4 has a plurality of fields, that is a keypad field 5, a decoding field 6, a processor field 7, an H-bridge field 8, and a converting field 9. Most of the fields 5 through 9 are provided with various active or passive circuit elements 10 such as integrated circuits, resistor, capacitors, diodes, and the like.

For use the connector 1 is stripped from the adjacent one by tearing across the web 13, and then its conductors are separated from each other, if necessary by tearing perforation lines 14 between them, and then folded over on themselves along crease lines 11. The resultant shape corresponds to that necessary to make the connections to the various subassemblies 3 in the door 12.

The keypad field 5 is adapted to be clamped via a perforated insulating sheet 15 to a face of a keypad provided with contacts so that the portions of conductors of the field 5 exposed through the holes in the insulating sheet form good electrical connections with the keypad contacts. The conductive strips 2 can similarly be imbedded in or applied to the surface of a flexible strip of electrically insulating material.

What is claimed is:

1. A connector for interconnecting a plurality of spaced electrical subassemblies in a motor-vehicle door, the connector comprising:

a basically rectangular, flexible, and electrically insulating foil having a core part and formed with a plurality of strips extending from the part and carrying conductive paths, the strips being separable from one another, formed with crosswise weakened lines, and foldable at the lines to extend to the different subassemblies, the foil being formed with perforations between the strips.

2. The connector defined in claim 1 wherein the core part has a plurality of different fields each provided with electronic circuit components.

3. The connector defined in claim 1 wherein the strips extend compactly next to one another prior to folding out for connection to the subassemblies.

4. The connector defined in claim 1 wherein the strips are stamped from the foil.

5. The connector defined in claim 1 wherein the core part is formed with a keypad field and is provided with an elastic perforated mat overlying the keypad field, whereby a keypad can engage through perforations in the mat with the conductive paths.

6. The connector defined in claim 1 wherein a plurality of such connectors are connected together in a roll with perforated tear lines between adjacent connectors.

7. The connector defined in claim 1 wherein the foil is made of a synthetic resin.

* * * * *